United States Patent
Yeh et al.

(10) Patent No.: US 11,508,853 B2
(45) Date of Patent: Nov. 22, 2022

(54) VERTICAL BIPOLAR TRANSISTOR DEVICE (71) Applicant: AMAZING MICROELECTRONIC CORP., New Taipei (TW)

(72) Inventors: Chih-Ting Yeh, Hsinchu County (TW); Sung-Chih Huang, Yilan County (TW); Che-Hao Chuang, Hsinchu County (TW)

(73) Assignee: Amazing Microelectronic Corp., New Taipei City (TW)

( * ) Notice: Subject to any disclaimer, the term of this patent is extended or adjusted under 35 U.S.C. 154(b) by 0 days.

(21) Appl. No.: 16/940,789

(22) Filed: Jul. 28, 2020

(65) Prior Publication Data
US 2022/0037537 A1 Feb. 3, 2022

(51) Int. Cl.
*H01L 29/861* (2006.01)
*H01L 29/06* (2006.01)
*H01L 29/08* (2006.01)

(52) U.S. Cl.
CPC ........ *H01L 29/861* (2013.01); *H01L 29/0619* (2013.01); *H01L 29/08* (2013.01)

(58) Field of Classification Search
CPC ... H01L 29/861; H01L 29/0619; H01L 29/08; H01L 2924/13056; H01L 31/11–1105; H01L 29/42304
See application file for complete search history.

(56) References Cited

U.S. PATENT DOCUMENTS

| | | | |
|---|---|---|---|
| 7,750,365 B2 | 7/2010 | Takahashi et al. | |
| 7,781,826 B2 | 8/2010 | Mallikararjunaswamy et al. | |
| 8,928,084 B2 | 1/2015 | Renaud et al. | |
| 9,666,700 B2 | 5/2017 | Hebert et al. | |
| 2003/0047750 A1 | 3/2003 | Russ et al. | |
| 2012/0104553 A1 | 5/2012 | Fujii | |
| 2015/0349104 A1* | 12/2015 | Rodov | H01L 29/7455 257/133 |
| 2017/0117266 A1 | 4/2017 | Coyne et al. | |

(Continued)

OTHER PUBLICATIONS

Communication From Taiwan Patent Office Regarding a Corresponding Foreign Application dated (Taiwan Year 109) Dec. 28, 2020.

(Continued)

*Primary Examiner* — Wasiul Haider
(74) *Attorney, Agent, or Firm* — Rosenberg, Klein & Lee (57) ABSTRACT

A vertical bipolar transistor device includes a heavily-doped semiconductor substrate, a first semiconductor epitaxial layer, at least one doped well, an isolation structure, and an external conductor. The heavily-doped semiconductor substrate and the doped well have a first conductivity type, and the first semiconductor epitaxial layer has a second conductivity type. The first semiconductor epitaxial layer is formed on the heavily-doped semiconductor substrate. The doped well is formed in the first semiconductor epitaxial layer. The isolation structure, formed in the heavily-doped semiconductor substrate and the first semiconductor epitaxial layer, surrounds the first semiconductor epitaxial layer and the at least one doped well. The external conductor is arranged outside the first semiconductor epitaxial layer and the doped well and electrically connected to the first semiconductor epitaxial layer and the doped well.

14 Claims, 9 Drawing Sheets

(56) References Cited

U.S. PATENT DOCUMENTS

2018/0286853 A1* 10/2018 Mallikarjunaswamy ............... H01L 29/7424
2020/0135714 A1* 4/2020 Mallikarjunaswamy ............... H01L 29/861

OTHER PUBLICATIONS

Communication/Search Report From Foreign Patent Office Regarding a Corresponding Foreign Application No. (11020876010) dated Sep. 7, 2021.

* cited by examiner

VERTICAL BIPOLAR TRANSISTOR DEVICE

BACKGROUND OF THE INVENTION

Field of the Invention

The present invention relates to the vertical electrostatic discharge (ESD) technology, particularly to a vertical bipolar transistor device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

Figure 1:
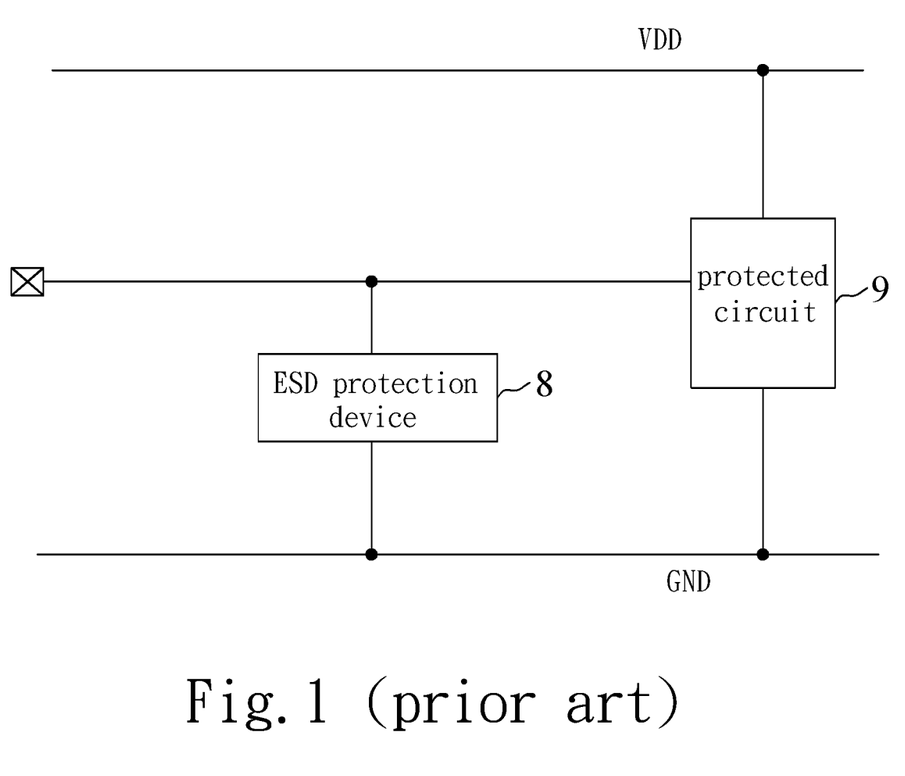
FIG. 1 is a schematic diagram illustrating an ESD protection device connected with a protected circuit on an IC chip in the conventional technology.

The working principle of ESD protection device is shown in FIG. 1. In FIG. 1, the ESD protection device 8 is connected in parallel with a protected circuit 9 on the IC chip. The ESD protection device 8 would be triggered immediately when the ESD event occurs. In that way, the ESD protection device 8 can provide a superiorly low resistance path for discharging the transient ESD current, so that the energy of the ESD transient current can be bypassed by the ESD protection device 8. For the purpose of reducing the size and surface areas occupied by the ESD protection device 8, a vertical transient voltage suppressor is implemented instead of a lateral transient voltage suppressor. For example, in the U.S. Pat. No. 8,928,084, a lateral ESD protection device is fabricated in an epitaxial layer and electrodes are formed on the surface of the ESD protection device. Thus, the electrodes occupy many footprint areas. In the U.S. Pat. No. 9,666,700, electrodes that are formed on the surface of the ESD protection device also occupy many footprint areas. On top of that, the conventional vertical transient voltage suppressor has some drawbacks. In the U.S. Pat. No. 7,750,365, an implant process needs to be implemented on the bottom of the insulated gate bipolar transistor although the insulated gate bipolar transistor is a vertical transient voltage suppressor. In the U.S. Pat. No. 7,781,826, the substrate and the epitaxial layer belong to the same conductivity type. Besides, the P-type well is used as the base of the BJT. The breakdown interface is formed between the P-type well and the epitaxial layer. The breakdown voltage of the interface is difficultly controlled since the depth of the P-type well depends on the width of the base.

To overcome the abovementioned problems, the present invention provides a vertical bipolar transistor device, so as to solve the afore-mentioned problems of the prior art.

SUMMARY OF THE INVENTION

The present invention provides a vertical bipolar transistor device, which freely adjusts the gain and the breakdown voltage of a bipolar junction transistor.

In an embodiment of the present invention, a vertical bipolar transistor device is provided. The vertical bipolar transistor device includes a heavily-doped semiconductor substrate, a first semiconductor epitaxial layer, at least one doped well, an isolation structure, and an external conductor. The heavily-doped semiconductor substrate and the doped well have a first conductivity type, and the first semiconductor epitaxial layer has a second conductivity type. The first semiconductor epitaxial layer is formed on the heavily-doped semiconductor substrate. The doped well is formed in the first semiconductor epitaxial layer. The isolation structure, formed in the heavily-doped semiconductor substrate and the first semiconductor epitaxial layer, surrounds the first semiconductor epitaxial layer and the at least one doped well. The external conductor is arranged outside the first semiconductor epitaxial layer and the doped well and electrically connected to the first semiconductor epitaxial layer and the doped well.

In an embodiment of the present invention, the first conductivity type is an N type and the second conductivity type is a P type.

In an embodiment of the present invention, the first conductivity type is a P type and the second conductivity type is an N type.

In an embodiment of the present invention, the vertical bipolar transistor device further include at least one first heavily-doped area, having the first conductivity type, formed in the at least one doped well; and at least one second heavily-doped area, having the second conductivity type, formed in the first semiconductor epitaxial layer, wherein the first semiconductor epitaxial layer is electrically connected to the at least one doped well through the at least one first heavily-doped area, the at least one second heavily-doped area, and the external conductor.

In an embodiment of the present invention, the at least one second heavily-doped area surrounds the at least one first heavily-doped area and the at least one doped well.

In an embodiment of the present invention, the at least one first heavily-doped area comprises a plurality of first heavily-doped areas, the at least one second heavily-doped area comprises a plurality of second heavily-doped areas, the at least one doped well comprises a plurality of doped wells, the plurality of first heavily-doped areas are respectively formed in the plurality of doped wells, and the plurality of doped wells and the plurality of second heavily-doped areas are alternately arranged.

In an embodiment of the present invention, the vertical bipolar transistor device further includes a heavily-doped buried layer formed between the heavily-doped semiconductor substrate and the first semiconductor epitaxial layer and under the at least one doped well.

In an embodiment of the present invention, the heavily-doped buried layer has the first conductivity type, and the bottom of the isolation structure is deeper than an interface between the heavily-doped buried layer and the first semiconductor epitaxial layer.

In an embodiment of the present invention, the heavily-doped buried layer has the second conductivity type, and the bottom of the isolation structure is deeper than an interface between the heavily-doped buried layer and the heavily-doped semiconductor substrate.

In an embodiment of the present invention, the heavily-doped buried layer touches the isolation structure.

In an embodiment of the present invention, the heavily-doped semiconductor substrate is electrically connected to a first pin and the external conductor is electrically connected to a second pin.

In an embodiment of the present invention, the vertical bipolar transistor device further includes a second semiconductor epitaxial layer formed between the heavily-doped semiconductor substrate and the first semiconductor epitaxial layer and under the at least one doped well.

In an embodiment of the present invention, the second semiconductor epitaxial layer has the first conductivity type, and a bottom of the isolation structure is deeper than an interface between the first semiconductor epitaxial layer and the second semiconductor epitaxial layer.

In an embodiment of the present invention, the second semiconductor epitaxial layer has the second conductivity type, and a bottom of the isolation structure is deeper than an interface between the second semiconductor epitaxial layer and the heavily-doped semiconductor substrate.

To sum up, the vertical bipolar transistor device can freely adjust the gain and the breakdown voltage of a bipolar junction transistor based on the resistivity and the thickness of the first semiconductor epitaxial layer. The vertical bipolar transistor device may have a larger range of the breakdown voltage based on the resistivity of the first semiconductor epitaxial layer and the heavily-doped buried layer.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

For the purpose of reducing the surface areas occupied by the ESD protection device, enhancing the ESD level without increasing the areas occupied by the ESD protection device, and achieving uniform current distribution and good heat dissipation, a vertical bipolar transistor device is provided.

Figure 2:
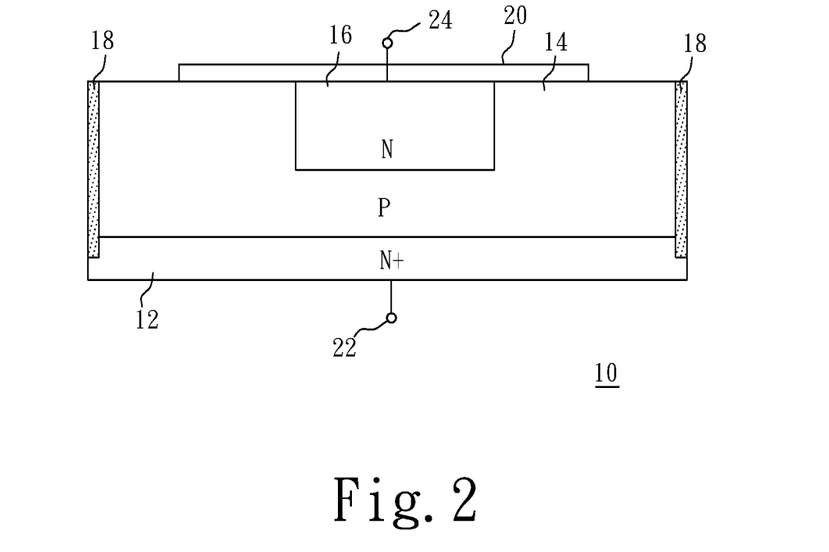
FIG. 2 is a cross-sectional view of a vertical bipolar transistor device according to the first embodiment of the present invention.

FIG. 2 is a cross-sectional view of a vertical bipolar transistor device according to the first embodiment of the present invention. Referring to FIG. 2, the first embodiment of the vertical bipolar transistor device 10 includes a heavily-doped semiconductor substrate 12, a first semiconductor epitaxial layer 14, at least one doped well 16, an isolation structure 18, and an external conductor 20. In the first embodiment, one or more doped wells 16 can be used. The first embodiment exemplifies one doped well 16 for clarity and convenience. The heavily-doped semiconductor substrate 12 and the doped well 16 have a first conductivity type, and the first semiconductor epitaxial layer 14 has a second conductivity type. In the first embodiment, the first conductivity type is an N type and the second conductivity type is a P type.

The first semiconductor epitaxial layer 14 is formed on the heavily-doped semiconductor substrate 12. The doped well 16 is formed in the first semiconductor epitaxial layer 14. The heavily-doped semiconductor substrate 12, the first semiconductor epitaxial layer 14, and the doped well 16 form a bipolar junction transistor (BJT), wherein the first semiconductor epitaxial layer 14 is used as the base of the BJT. The gain and the breakdown voltage of the BJT are freely adjusted based on the resistivity and the thickness of the epitaxial layer 14 since the resistivity and the thickness of the first semiconductor epitaxial layer 14 are easily adjusted. The isolation structure 18 includes oxide or insulation material, but the present invention is not limited thereto. The isolation structure 18 is formed in the heavily-doped semiconductor substrate 12 and the first semiconductor epitaxial layer 14. The isolation structure 18 surrounds the first semiconductor epitaxial layer 14 and the doped well 16. In practice, the vertical bipolar transistor device 10 is a die that is sawed from a wafer. When sawing the die from the wafer, the die is sawed along the outside of the isolation structure 18 to avoid causing damage to the breakdown interface between the heavily-doped semiconductor substrate 12 and the first semiconductor epitaxial layer 14. The external conductor 20 is arranged outside the first semiconductor epitaxial layer 14 and the doped well 16 and electrically connected to the first semiconductor epitaxial layer 14 and the doped well 16. The external conductor 20 includes, but not limited to, a conductive layer and welding wires. For example, the external conductor 20 may be a conductive layer formed on the outside of the first semiconductor epitaxial layer 14 and the doped well 16. Specifically, the conductive layer is formed on the top of the first semiconductor epitaxial layer 14 and the doped well 16. The heavily-doped semiconductor substrate 12 is electrically connected to a first pin 22. The external conductor 20 is electrically connected to a second pin 24.

When positive ESD energy is applied to the first pin 22 and the second pin 24 is grounded, the ESD current flows from the first pin 22 to the second pin 24 through the heavily-doped semiconductor substrate 12, the first semiconductor epitaxial layer 14, and the doped well 16. The breakdown interface is formed between the heavily-doped semiconductor substrate 12 and the first semiconductor epitaxial layer 14. Since the first semiconductor epitaxial layer 14 and the doped well 16 have the same voltage due to the external conductor 20, the current crowding effect does not occur at the corner of the doped well 16.

Figure 3:
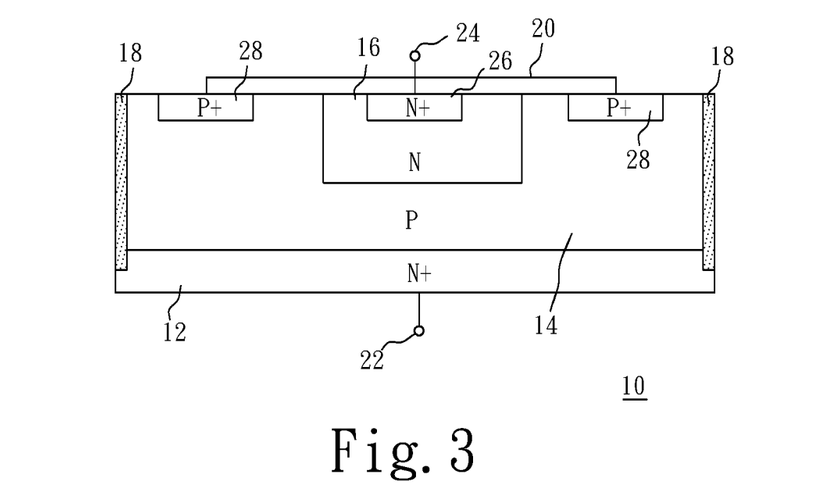
FIG. 3 is a cross-sectional view of a vertical bipolar transistor device according to the second embodiment of the present invention.

FIG. 3 is a cross-sectional view of a vertical bipolar transistor device according to the second embodiment of the present invention. Referring to FIG. 3, the second embodiment of the vertical bipolar transistor device 10 is introduced as follows. Compared with the first embodiment, the second embodiment may further include at least one first heavily-doped area 26 and at least one second heavily-doped area 28. The second embodiment uses one or more first heavily-doped areas 26 and one or more second heavily-doped areas 28 and exemplifies one first heavily-doped area 26 and one second heavily-doped area 28. The first heavily-doped area 26 has the first conductivity type. The second heavily-doped area 28 has the second conductivity type. The first heavily-doped area 26 is formed in the doped well 16. The second heavily-doped area 28 is formed in the first semiconductor epitaxial layer 14. The second heavily-doped area 28 may surround the doped well 16 and the first heavily-doped area 26. The doped well 16 is electrically connected to the external conductor 20 through the first heavily-doped area 26. The first semiconductor epitaxial layer 14 is electrically connected to the external conductor 20 through the second heavily-doped area 28. The first semiconductor epitaxial layer 14 is electrically connected to the doped well 16 through the first heavily-doped area 26, the second heavily-doped area 28, and the external conductor 20. If the external conductor 20 is implemented with a conductive layer, the conductive layer may be formed on the top of the first heavily-doped area 26 and the second heavily-doped area 28. The first heavily-doped area 26 and the second heavily-doped area 28 are respectively used as ohmic contacts of the doped well 16 and the first semiconductor epitaxial layer 14 and used to decrease the resistance between the external conductor 20 and the doped well 16 and the resistance between the external conductor 20 and the first semiconductor epitaxial layer 14.

When positive ESD energy is applied to the first pin 22 and the second pin 24 is grounded, the ESD current flows from the first pin 22 to the second pin 24 through the heavily-doped semiconductor substrate 12, the first semiconductor epitaxial layer 14, the doped well 16, and the first heavily-doped area 26. The breakdown interface is formed between the heavily-doped semiconductor substrate 12 and the first semiconductor epitaxial layer 14. Since the first heavily-doped area 26, the second heavily-doped area 28, the first semiconductor epitaxial layer 14 and the doped well 16 have the same voltage due to the external conductor 20, the current crowding effect does not occur at the corner of the doped well 16.

Figure 4:
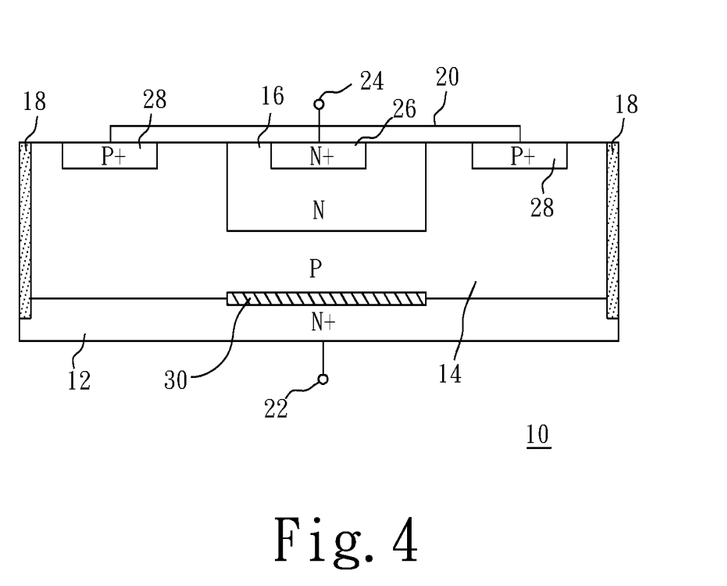
FIG. 4 is a cross-sectional view of a vertical bipolar transistor device according to the third embodiment of the present invention.

FIG. 4 is a cross-sectional view of a vertical bipolar transistor device according to the third embodiment of the present invention. Referring to FIG. 4, the third embodiment of the vertical bipolar transistor device 10 is introduced as follows. Compared with the second embodiment, the third embodiment may further include a heavily-doped buried layer 30 formed between the heavily-doped semiconductor substrate 12 and the first semiconductor epitaxial layer 14 and under the doped well 16. The heavily-doped buried layer 30 may separate from the isolation structure 18. The heavily-doped buried layer 30 and the doped well 16 have the same horizontal position. The heavily-doped buried layer 30 has the first conductivity type or the second conductivity type.

When the heavily-doped buried layer 30 has the first conductivity type, the breakdown interface is formed between the heavily-doped buried layer 30 and the first semiconductor epitaxial layer 14. Although the heavily-doped buried layer 30 and the heavily-doped semiconductor substrate 12 belong to the same conductivity type, the free energy of ions of the heavily-doped buried layer 30 is usually higher than the free energy of ions of the heavily-doped semiconductor substrate 12 due to a fact that the heavily-doped buried layer 30 and the heavily-doped semiconductor substrate 12 are doped with different materials. For example, the heavily-doped buried layer 30 is doped with phosphorous atoms and the heavily-doped semiconductor substrate 12 is doped with arsenic atoms. Thus, the breakdown voltage of an interface between the heavily-doped buried layer 30 and the first semiconductor epitaxial layer 14 is usually lower than the breakdown voltage of an interface between the first semiconductor epitaxial layer 14 and the heavily-doped semiconductor substrate 12. In such a case, the bottom of the isolation structure 18 is deeper than an interface between the heavily-doped buried layer 30 and the first semiconductor epitaxial layer 14, such that the isolation structure 18 protects the breakdown interface between the heavily-doped buried layer 30 and the first semiconductor epitaxial layer 14. When the heavily-doped buried layer 30 has the second conductivity type, the breakdown interface is formed between the heavily-doped buried layer 30 and the heavily-doped semiconductor substrate 12. The vertical bipolar transistor device 10 may have a larger range of the breakdown voltage based on the resistivity of the first semiconductor epitaxial layer 14 and the heavily-doped buried layer 30. In such a case, the bottom of the isolation structure 18 is deeper than an interface between the heavily-doped buried layer 30 and the heavily-doped semiconductor substrate 12, such that the isolation structure 18 protects the breakdown interface between the heavily-doped semiconductor substrate 12 and the heavily-doped buried layer 30.

When positive ESD energy is applied to the first pin 22 and the second pin 24 is grounded, the ESD current flows from the first pin 22 to the second pin 24 through the heavily-doped semiconductor substrate 12, the heavily-doped buried layer 30, the first semiconductor epitaxial layer 14, the doped well 16, and the first heavily-doped area 26. The breakdown interface is formed between the heavily-doped semiconductor substrate 12 and the heavily-doped buried layer 30 or between the heavily-doped buried layer 30 and the first semiconductor epitaxial layer 14. Besides, the current crowding effect does not occur at the corner of the doped well 16. This is because the first heavily-doped area 26, the second heavily-doped area 28, the first semiconductor epitaxial layer 14 and the doped well 16 have the same voltage due to the external conductor 20. Most of the ESD current only flows through the heavily-doped buried layer 30 rather than the surrounding of the first semiconductor epitaxial layer 14. Thus, the ESD current does not flow through the corner of the doped well 16. The vertical bipolar transistor device 10 may have a larger range of the breakdown voltage based on the resistivity of the first semiconductor epitaxial layer 14 and the heavily-doped buried layer 30.

Figure 5:
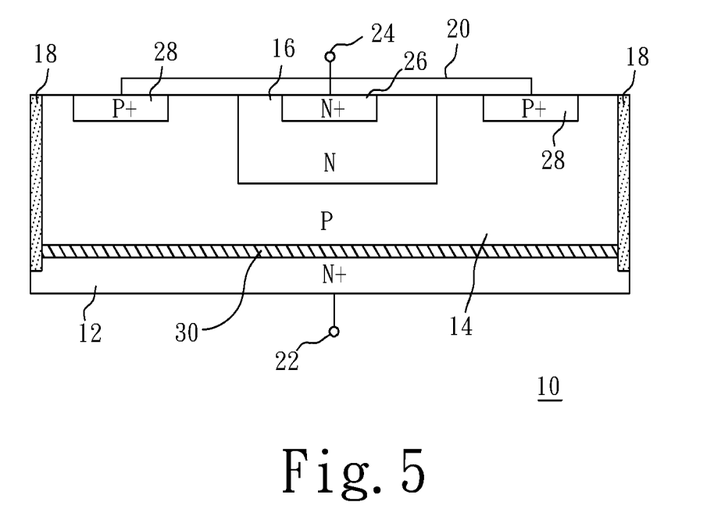
FIG. 5 is a cross-sectional view of a vertical bipolar transistor device according to the fourth embodiment of the present invention.

FIG. 5 is a cross-sectional view of a vertical bipolar transistor device according to the fourth embodiment of the present invention. Referring to FIG. 5, the fourth embodiment of the vertical bipolar transistor device 10 is introduced as follows. Compared with the third embodiment, the heavily-doped buried layer 30 of the fourth embodiment further may completely cover the heavily-doped semiconductor substrate 12 and touch the isolation structure 18. The heavily-doped buried layer 30 is formed using blanket implantation, whereby one photo-mask process can be saved to reduce the fabrication cost.

Figure 6:
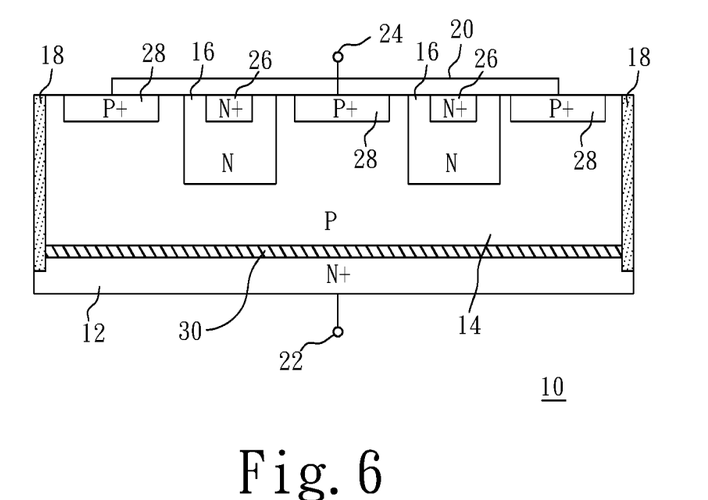
FIG. 6 is a cross-sectional view of a vertical bipolar transistor device according to the fifth embodiment of the present invention.

FIG. 6 is a cross-sectional view of a vertical bipolar transistor device according to the fifth embodiment of the present invention. Referring to FIG. 6, the fifth embodiment of the vertical bipolar transistor device 10 is introduced as follows. Compared with the fourth embodiment, the fifth embodiment exemplifies a plurality of first heavily-doped areas 26, a plurality of second heavily-doped areas 28, and a plurality of doped wells 16. The plurality of first heavily-doped areas 26 are respectively formed in the plurality of doped wells 16. The plurality of doped wells 16 and the plurality of second heavily-doped areas 28 are alternately arranged.

When positive ESD energy is applied to the first pin 22 and the second pin 24 is grounded, the ESD current flows from the first pin 22 to the second pin 24 through the heavily-doped semiconductor substrate 12, the heavily-doped buried layer 30, the first semiconductor epitaxial layer 14, the doped wells 16, and the first heavily-doped areas 26. The breakdown interface is formed between the heavily-doped semiconductor substrate 12 and the heavily-doped buried layer 30 or between the heavily-doped buried layer 30 and the first semiconductor epitaxial layer 14. Besides, the current crowding effect does not occur at the corner of the doped wells 16. This is because the first heavily-doped areas 26, the second heavily-doped areas 28, the first semiconductor epitaxial layer 14 and the doped well 16 have the same voltage due to the external conductor 20. In the fifth embodiment, there is a plurality of BJTs, wherein the number of BJTs depends on the number of the doped wells 16. The plurality of BJTs surrounded by the isolation structure 18 can improve the uniformity of the ESD current and the ESD level.

Figure 7:
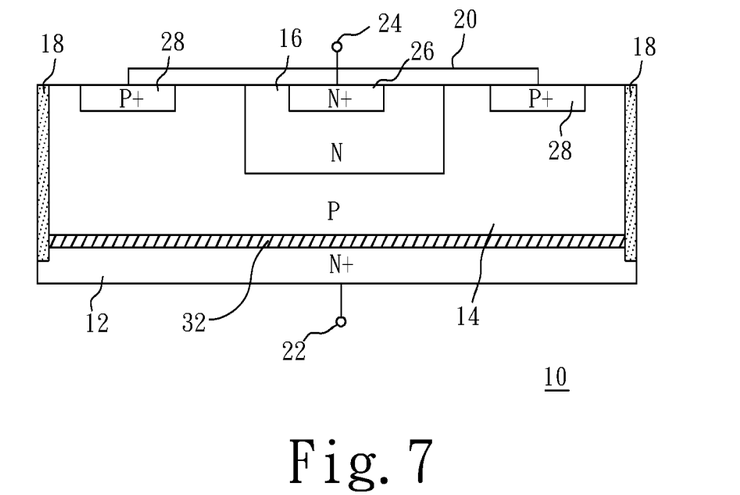
FIG. 7 is a cross-sectional view of a vertical bipolar transistor device according to the sixth embodiment of the present invention.

FIG. 7 is a cross-sectional view of a vertical bipolar transistor device according to the sixth embodiment of the present invention. Referring to FIG. 7, the sixth embodiment of the vertical bipolar transistor device 10 is introduced as follows. Compared with the second embodiment, the sixth embodiment may further include a second semiconductor epitaxial layer 32 formed between the heavily-doped semiconductor substrate 12 and the first semiconductor epitaxial layer 14 and under the doped well 16. The second semiconductor epitaxial layer 32 may completely cover the heavily-doped semiconductor substrate 12. The second semiconductor epitaxial layer 32 has the first conductivity type or the second conductivity type.

When the second semiconductor epitaxial layer 32 has the first conductivity type, the breakdown interface is formed between the second semiconductor epitaxial layer 32 and the first semiconductor epitaxial layer 14. Although the second semiconductor epitaxial layer 32 and the heavily-doped semiconductor substrate 12 belong to the same conductivity type, the free energy of ions of the second semiconductor epitaxial layer 32 is usually higher than the free energy of ions of the heavily-doped semiconductor substrate 12 due to a fact that the second semiconductor epitaxial layer 32 and the heavily-doped semiconductor substrate 12 are doped with different materials. For example, the second semiconductor epitaxial layer 32 is doped with phosphorous atoms and the heavily-doped semiconductor substrate 12 is doped with arsenic atoms. Thus, the breakdown voltage of an interface between the second semiconductor epitaxial layer 32 and the first semiconductor epitaxial layer 14 is usually lower than the breakdown voltage of an interface between the first semiconductor epitaxial layer 14 and the heavily-doped semiconductor substrate 12. In such a case, the bottom of the isolation structure 18 is deeper than an interface between the second semiconductor epitaxial layer 32 and the first semiconductor epitaxial layer 14, such that the isolation structure 18 protects the breakdown interface between the second semiconductor epitaxial layer 32 and the first semiconductor epitaxial layer 14. When the second semiconductor epitaxial layer 32 has the second conductivity type, the breakdown interface is formed between the second semiconductor epitaxial layer 32 and the heavily-doped semiconductor substrate 12. The vertical bipolar transistor device 10 may have a larger range of the breakdown voltage based on the resistivity of the first semiconductor epitaxial layer 14 and the second semiconductor epitaxial layer 32. In such a case, the bottom of the isolation structure 18 is deeper than an interface between the second semiconductor epitaxial layer 32 and the heavily-doped semiconductor substrate 12, such that the isolation structure 18 protects the breakdown interface between the heavily-doped semiconductor substrate 12 and the second semiconductor epitaxial layer 32.

When positive ESD energy is applied to the first pin 22 and the second pin 24 is grounded, the ESD current flows from the first pin 22 to the second pin 24 through the heavily-doped semiconductor substrate 12, the second semiconductor epitaxial layer 32, the first semiconductor epitaxial layer 14, the doped well 16, and the first heavily-doped area 26. The breakdown interface is formed between the heavily-doped semiconductor substrate 12 and the second semiconductor epitaxial layer 32 or between the second semiconductor epitaxial layer 32 and the first semiconductor epitaxial layer 14. Besides, the current crowding effect does not occur at the corner of the doped well 16. This is because the first heavily-doped area 26, the second heavily-doped area 28, the first semiconductor epitaxial layer 14 and the doped well 16 have the same voltage due to the external conductor 20. Thus, the ESD current does not flow through the corner of the doped well 16. The vertical bipolar transistor device 10 may have a larger range of the breakdown voltage based on the resistivity of the first semiconductor epitaxial layer 14 and the second semiconductor epitaxial layer 32.

Figure 8:
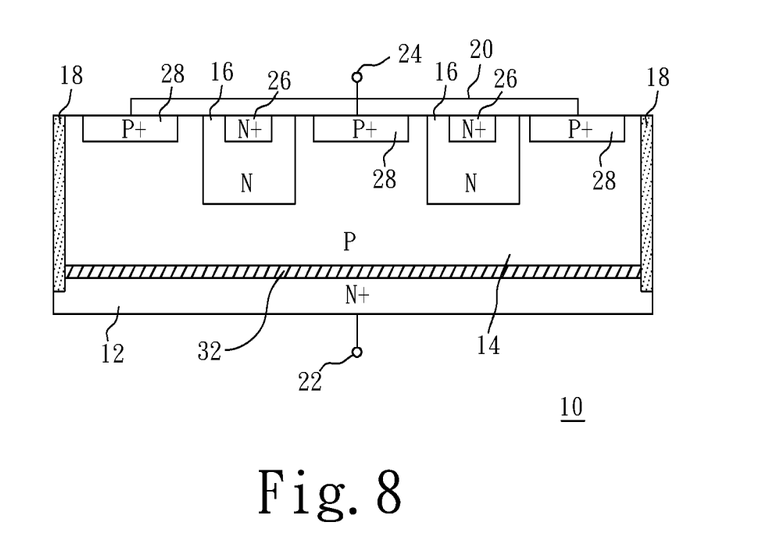
FIG. 8 is a cross-sectional view of a vertical bipolar transistor device according to the seventh embodiment of the present invention.

FIG. 8 is a cross-sectional view of a vertical bipolar transistor device according to the seventh embodiment of the present invention. Referring to FIG. 8, the seventh embodiment of the vertical bipolar transistor device 10 is introduced as follows. Compared with the sixth embodiment, the seventh embodiment exemplifies a plurality of first heavily-doped areas 26, a plurality of second heavily-doped areas 28, and a plurality of doped wells 16. The plurality of first heavily-doped areas 26 are respectively formed in the plurality of doped wells 16. The plurality of doped wells 16 and the plurality of second heavily-doped areas 28 are alternately arranged.

When positive ESD energy is applied to the first pin 22 and the second pin 24 is grounded, the ESD current flows from the first pin 22 to the second pin 24 through the heavily-doped semiconductor substrate 12, the second semiconductor epitaxial layer 32, the first semiconductor epitaxial layer 14, the doped wells 16, and the first heavily-doped areas 26. The breakdown interface is formed between the heavily-doped semiconductor substrate 12 and the second semiconductor epitaxial layer 32 or between the second semiconductor epitaxial layer 32 and the first semiconductor epitaxial layer 14. Besides, the current crowding effect does not occur at the corner of the doped wells 16. This is because the first heavily-doped areas 26, the second heavily-doped areas 28, the first semiconductor epitaxial layer 14 and the doped well 16 have the same voltage due to the external conductor 20. In the seventh embodiment, there is a plurality of BJTs, wherein the number of BJTs depends on the number of the doped wells 16. The plurality of BJTs surrounded by the isolation structure 18 can improve the uniformity of the ESD current and the ESD level.

Figure 9:
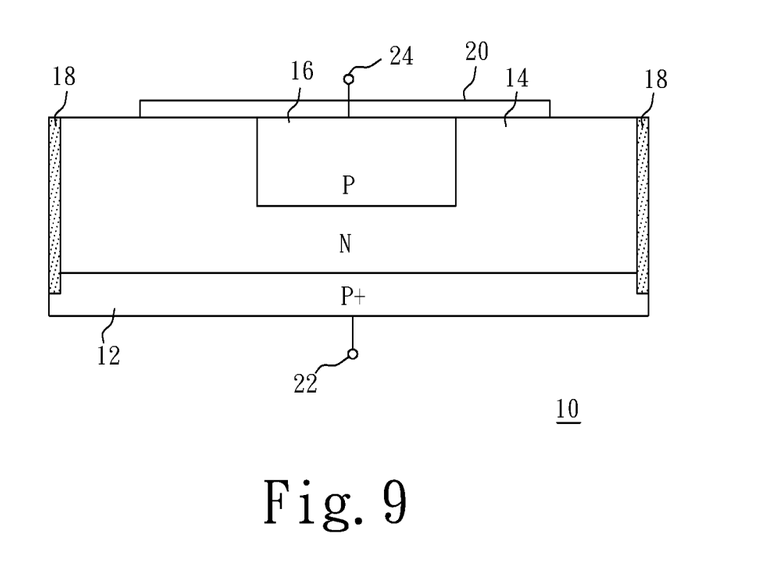
FIG. 9 is a cross-sectional view of a vertical bipolar transistor device according to the eighth embodiment of the present invention.

FIG. 9 is a cross-sectional view of a vertical bipolar transistor device according to the eighth embodiment of the present invention. The eighth embodiment is different from the first embodiment in the conductivity types. The first conductivity type and the second conductivity type of the eighth embodiment are respectively a P type and an N type. The other structures of the eighth embodiment have been described in the first embodiment so will not be reiterated.

When positive ESD energy is applied to the second pin 24 and the first pin 22 is grounded, the ESD current flows from the second pin 24 to the first pin 22 through the doped well 16, the first semiconductor epitaxial layer 14, and the heavily-doped semiconductor substrate 12. The breakdown interface is formed between the heavily-doped semiconductor substrate 12 and the first semiconductor epitaxial layer 14. Since the first semiconductor epitaxial layer 14 and the doped well 16 have the same voltage due to the external conductor 20, the current crowding effect does not occur at the corner of the doped well 16.

Figure 10:
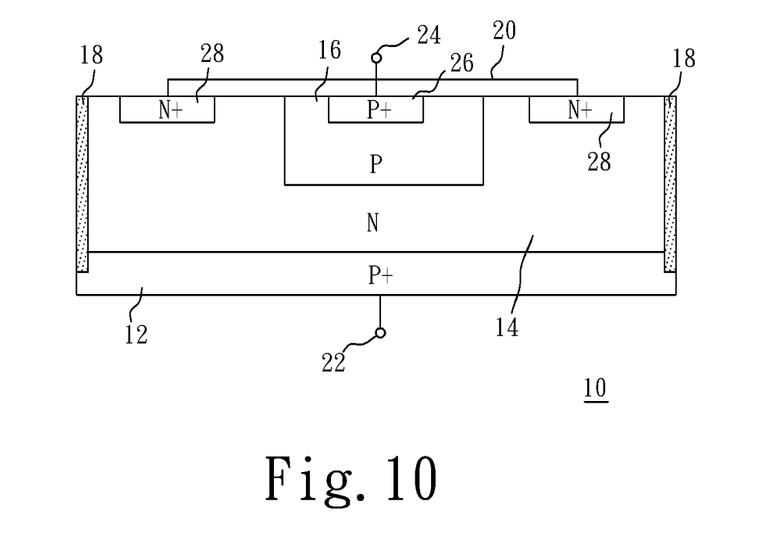
FIG. 10 is a cross-sectional view of a vertical bipolar transistor device according to the ninth embodiment of the present invention.

FIG. 10 is a cross-sectional view of a vertical bipolar transistor device according to the ninth embodiment of the present invention. The ninth embodiment is different from the second embodiment in the conductivity types. The first conductivity type and the second conductivity type of the ninth embodiment are respectively a P type and an N type. The other structures of the ninth embodiment have been described in the second embodiment so will not be reiterated.

When positive ESD energy is applied to the second pin 24 and the first pin 22 is grounded, the ESD current flows from the second pin 24 to the first pin 22 through the first heavily-doped area 26, the doped well 16, the first semiconductor epitaxial layer 14, and the heavily-doped semiconductor substrate 12. The breakdown interface is formed between the heavily-doped semiconductor substrate 12 and the first semiconductor epitaxial layer 14. Since the first heavily-doped area 26, the second heavily-doped area 28, the first semiconductor epitaxial layer 14 and the doped well 16 have the same voltage due to the external conductor 20, the current crowding effect does not occur at the corner of the doped well 16.

Figure 11:
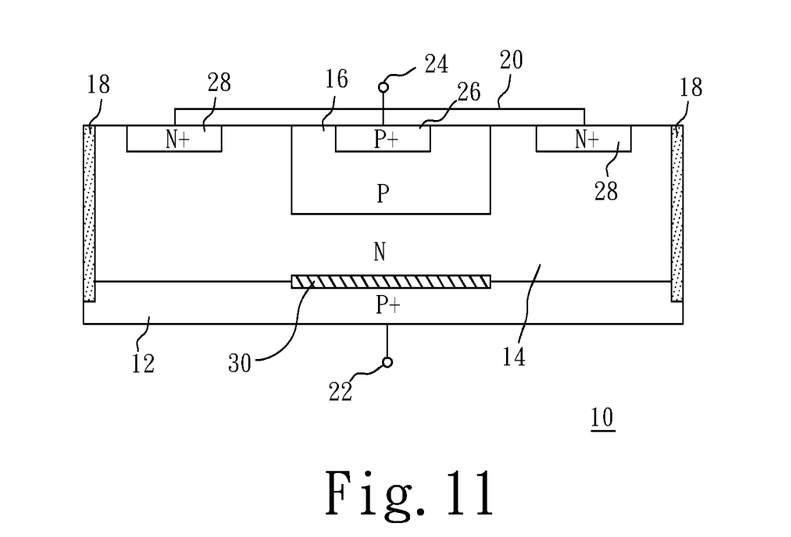
FIG. 11 is a cross-sectional view of a vertical bipolar transistor device according to the tenth embodiment of the present invention.

FIG. 11 is a cross-sectional view of a vertical bipolar transistor device according to the tenth embodiment of the present invention. The tenth embodiment is different from the third embodiment in the conductivity types. The first conductivity type and the second conductivity type of the tenth embodiment are respectively a P type and an N type. The other structures of the tenth embodiment have been described in the third embodiment so will not be reiterated.

When positive ESD energy is applied to the second pin 24 and the first pin 22 is grounded, the ESD current flows from the second pin 24 to the first pin 22 through the first heavily-doped area 26, the doped well 16, the first semiconductor epitaxial layer 14, the heavily-doped buried layer 30, and the heavily-doped semiconductor substrate 12. The breakdown interface is formed between the heavily-doped semiconductor substrate 12 and the heavily-doped buried layer 30 or between the heavily-doped buried layer 30 and the first semiconductor epitaxial layer 14. Besides, the current crowding effect does not occur at the corner of the doped well 16. This is because the first heavily-doped area 26, the second heavily-doped area 28, the first semiconductor epitaxial layer 14 and the doped well 16 have the same voltage due to the external conductor 20. Most of the ESD current only flows through the heavily-doped buried layer 30 rather than the surrounding of the first semiconductor epitaxial layer 14. Thus, the ESD current does not flow through the corner of the doped well 16. The vertical bipolar transistor device 10 may have a larger range of the breakdown voltage based on the resistivity of the first semiconductor epitaxial layer 14 and the heavily-doped buried layer 30.

Figure 12:
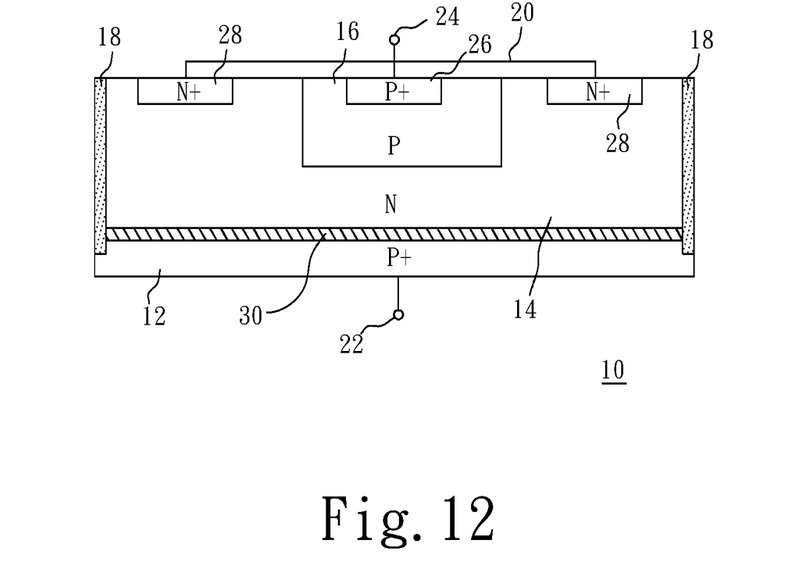
FIG. 12 is a cross-sectional view of a vertical bipolar transistor device according to the eleventh embodiment of the present invention.

FIG. 12 is a cross-sectional view of a vertical bipolar transistor device according to the eleventh embodiment of the present invention. The eleventh embodiment is different from the fourth embodiment in the conductivity types. The first conductivity type and the second conductivity type of the eleventh embodiment are respectively a P type and an N type. The other structures of the eleventh embodiment have been described in the fourth embodiment so will not be reiterated.

Figure 13:
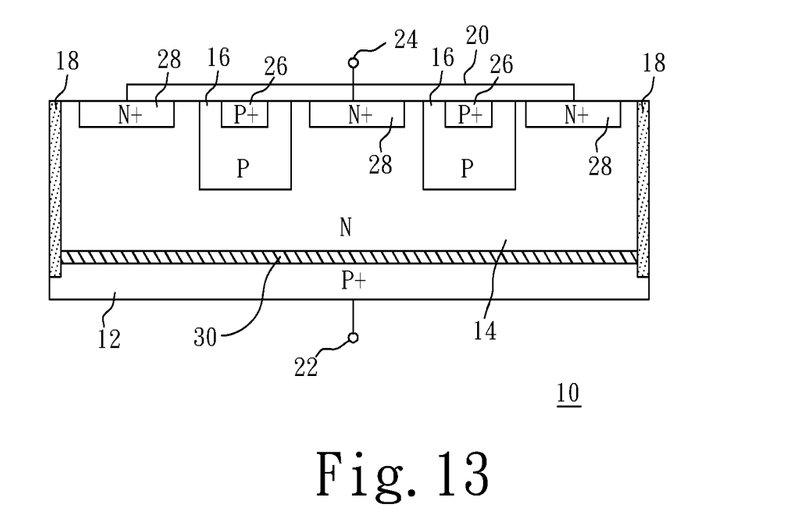
FIG. 13 is a cross-sectional view of a vertical bipolar transistor device according to the twelfth embodiment of the present invention.

FIG. 13 is a cross-sectional view of a vertical bipolar transistor device according to the twelfth embodiment of the present invention. The twelfth embodiment is different from the fifth embodiment in the conductivity types. The first conductivity type and the second conductivity type of the twelfth embodiment are respectively a P type and an N type. The other structures of the twelfth embodiment have been described in the fifth embodiment so will not be reiterated.

When positive ESD energy is applied to the second pin 24 and the first pin 22 is grounded, the ESD current flows from the second pin 24 to the first pin 22 through the first heavily-doped areas 26, the doped wells 16, the first semiconductor epitaxial layer 14, the heavily-doped buried layer 30, and the heavily-doped semiconductor substrate 12. The breakdown interface is formed between the heavily-doped semiconductor substrate 12 and the heavily-doped buried layer 30 or between the heavily-doped buried layer 30 and the first semiconductor epitaxial layer 14. Besides, the current crowding effect does not occur at the corner of the doped wells 16. This is because the first heavily-doped areas 26, the second heavily-doped areas 28, the first semiconductor epitaxial layer 14 and the doped well 16 have the same voltage due to the external conductor 20. In the twelfth embodiment, there is a plurality of BJTs, wherein the number of BJTs depends on the number of the doped wells 16. The plurality of BJTs surrounded by the isolation structure 18 can improve the uniformity of the ESD current and the ESD level.

Figure 14:
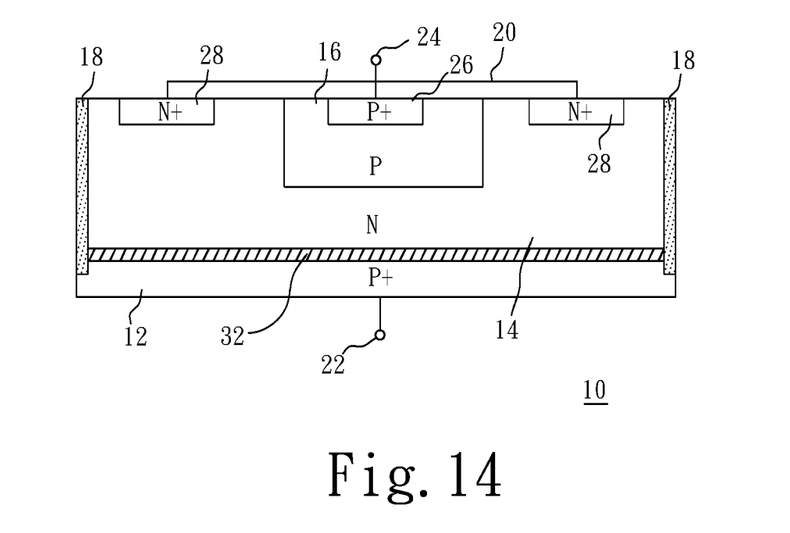
FIG. 14 is a cross-sectional view of a vertical bipolar transistor device according to the thirteenth embodiment of the present invention.

FIG. 14 is a cross-sectional view of a vertical bipolar transistor device according to the thirteenth embodiment of the present invention. The thirteenth embodiment is different from the sixth embodiment in the conductivity types. The first conductivity type and the second conductivity type of the thirteenth embodiment are respectively a P type and an N type. The other structures of the thirteenth embodiment have been described in the sixth embodiment so will not be reiterated.

When positive ESD energy is applied to the second pin 24 and the first pin 22 is grounded, the ESD current flows from the second pin 24 to the first pin 22 through the first heavily-doped area 26, the doped well 16, the first semiconductor epitaxial layer 14, the second semiconductor epitaxial layer 32, and the heavily-doped semiconductor substrate 12. The breakdown interface is formed between the heavily-doped semiconductor substrate 12 and the second semiconductor epitaxial layer 32 or between the second semiconductor epitaxial layer 32 and the first semiconductor epitaxial layer 14. Besides, the current crowding effect does not occur at the corner of the doped well 16. This is because the first heavily-doped area 26, the second heavily-doped area 28, the first semiconductor epitaxial layer 14 and the doped well 16 have the same voltage due to the external conductor 20. Thus, the ESD current does not flow through the corner of the doped well 16. The vertical bipolar transistor device 10 may have a larger range of the breakdown voltage based on the resistivity of the first semiconductor epitaxial layer 14 and the second semiconductor epitaxial layer 32.

Figure 15:
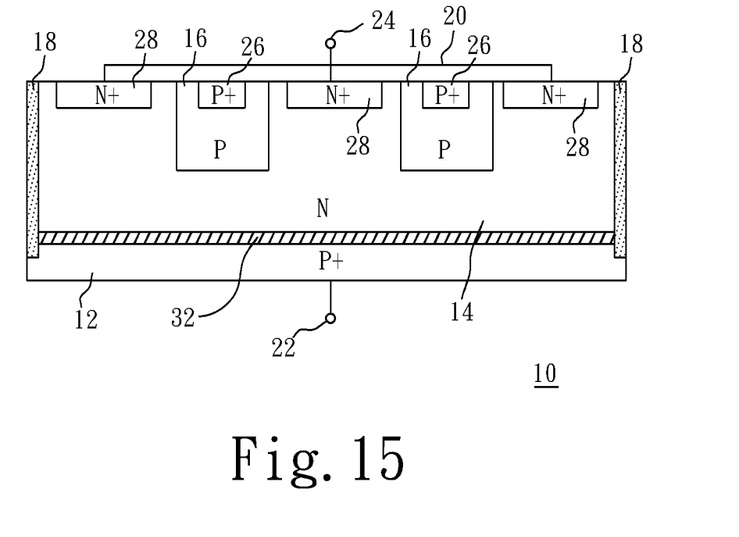
FIG. 15 is a cross-sectional view of a vertical bipolar transistor device according to the fourteenth embodiment of the present invention.

FIG. 15 is a cross-sectional view of a vertical bipolar transistor device according to the fourteenth embodiment of the present invention. The fourteenth embodiment is different from the seventh embodiment in the conductivity types. The first conductivity type and the second conductivity type of the fourteenth embodiment are respectively a P type and an N type. The other structures of the fourteenth embodiment have been described in the seventh embodiment so will not be reiterated.

When positive ESD energy is applied to the second pin 24 and the first pin 22 is grounded, the ESD current flows from the second pin 24 to the first pin 22 through the first heavily-doped areas 26, the doped wells 16, the first semiconductor epitaxial layer 14, the second semiconductor epitaxial layer 32, and the heavily-doped semiconductor substrate 12. The breakdown interface is formed between the heavily-doped semiconductor substrate 12 and the second semiconductor epitaxial layer 32 or between the second semiconductor epitaxial layer 32 and the first semiconductor epitaxial layer 14. Besides, the current crowding effect does not occur at the corner of the doped wells 16. This is because the first heavily-doped areas 26, the second heavily-doped areas 28, the first semiconductor epitaxial layer 14 and the doped well 16 have the same voltage due to the external conductor 20. In the fourteenth embodiment, there is a plurality of BJTs, wherein the number of BJTs depends on the number of the doped wells 16. The plurality of BJTs surrounded by the isolation structure 18 can improve the uniformity of the ESD current and the ESD level.

According to the embodiments provided above, the vertical bipolar transistor device can adjust a gain and a breakdown voltage based on the resistivity and the thickness of the first semiconductor epitaxial layer. The vertical bipolar transistor device may have a larger range of the breakdown voltage based on the resistivity of the first semiconductor epitaxial layer and the heavily-doped buried layer.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A vertical bipolar transistor device comprising:
    a heavily-doped semiconductor substrate having a first conductivity type;
    a first semiconductor epitaxial layer, having a second conductivity type, formed on the heavily-doped semiconductor substrate and used as a base of the vertical bipolar transistor device;
    at least one doped well, having the first conductivity type, formed in the first semiconductor epitaxial layer;
    an isolation structure, formed in the heavily-doped semiconductor substrate and the first semiconductor epitaxial layer, surrounding the first semiconductor epitaxial layer and the at least one doped well; and
    an external conductor positionally located external to and in abutting relation to the first semiconductor epitaxial layer and the at least one doped well and directly electrically connected to the first semiconductor epitaxial layer and the at least one doped well;
    wherein the first conductivity type is opposite to the second conductivity type.

2. The vertical bipolar transistor device according to claim 1, wherein the first conductivity type is an N type and the second conductivity type is a P type.

3. The vertical bipolar transistor device according to claim 1, wherein the first conductivity type is a P type and the second conductivity type is an N type.

4. The vertical bipolar transistor device according to claim 1, wherein an at least one second heavily-doped area surrounds an at least one first heavily-doped area and the at least one doped well.

5. The vertical bipolar transistor device according to claim 1, wherein an at least one first heavily-doped area comprises a plurality of first heavily-doped areas, an at least one second heavily-doped area comprises a plurality of second heavily-doped areas, the at least one doped well comprises a plurality of doped wells, the plurality of first heavily-doped areas are respectively formed in the plurality of doped wells, and the plurality of doped wells and the plurality of second heavily-doped areas are alternately arranged.

6. The vertical bipolar transistor device according to claim 1, wherein the heavily-doped semiconductor substrate is electrically connected to a first pin and the external conductor is electrically connected to a second pin.

7. The vertical bipolar transistor device according to claim 1, further comprising a second semiconductor epitaxial layer formed between the heavily-doped semiconductor substrate and the first semiconductor epitaxial layer and under the at least one doped well.

8. The vertical bipolar transistor device according to claim 7, wherein the second semiconductor epitaxial layer has the first conductivity type, and a bottom of the isolation structure is deeper than an interface between the second semiconductor epitaxial layer and the first semiconductor epitaxial layer.

9. The vertical bipolar transistor device according to claim 7, wherein the second semiconductor epitaxial layer has the second conductivity type, and a bottom of the isolation structure is deeper than an interface between the second semiconductor epitaxial layer and the heavily-doped semiconductor substrate.

10. A vertical bipolar transistor device comprising:
- a heavily-doped semiconductor substrate having a first conductivity type;
- a first semiconductor epitaxial layer, having a second conductivity type, formed on the heavily-doped semiconductor substrate and used as a base of the vertical bipolar transistor device, wherein the first conductivity type is opposite to the second conductivity type;
- at least one doped well, having the first conductivity type, formed in the first semiconductor epitaxial layer;
- an isolation structure, formed in the heavily-doped semiconductor substrate and the first semiconductor epitaxial layer, surrounding the first semiconductor epitaxial layer and the at least one doped well;
- an external conductor positionally located external to and in abutting relation to the first semiconductor epitaxial layer and the at least one doped well and directly electrically connected to the first semiconductor epitaxial layer and the at least one doped well;
- at least one first heavily-doped area, having the first conductivity type, formed in the at least one doped well; and
- at least one second heavily-doped area, having the second conductivity type, formed in the first semiconductor epitaxial layer, wherein the first semiconductor epitaxial layer is electrically connected to the at least one doped well through the at least one first heavily-doped area, the at least one second heavily-doped area, and the external conductor.

11. The vertical bipolar transistor device according to claim 10, further comprising a heavily-doped buried layer formed between the heavily-doped semiconductor substrate and the first semiconductor epitaxial layer and under the at least one doped well.

12. The vertical bipolar transistor device according to claim 11, wherein the heavily-doped buried layer has the first conductivity type, and a bottom of the isolation structure is deeper than an interface between the heavily-doped buried layer and the first semiconductor epitaxial layer.

13. The vertical bipolar transistor device according to claim 11, wherein the heavily-doped buried layer has the second conductivity type, and a bottom of the isolation structure is deeper than an interface between the heavily-doped buried layer and the heavily-doped semiconductor substrate.

14. The vertical bipolar transistor device according to claim 11, wherein the heavily-doped buried layer touches the isolation structure.

* * * * *